United States Patent
Lu et al.

(10) Patent No.: US 8,080,499 B2
(45) Date of Patent: Dec. 20, 2011

(54) NANODIAMOND THERMAL GREASE

(75) Inventors: Hung-Tu Lu, Taipei (TW); Sergey Uvarov, Moscow (RU)

(73) Assignee: Kunshan Nano New Material Technology Co., Ltd., Jiangsu (CN)

( * ) Notice: Subject to any disclaimer, the term of this patent is extended or adjusted under 35 U.S.C. 154(b) by 352 days.

(21) Appl. No.: 12/252,518

(22) Filed: Oct. 16, 2008

(65) Prior Publication Data
US 2010/0022423 A1    Jan. 28, 2010

(30) Foreign Application Priority Data

Jul. 23, 2008 (TW) ................. 97127992 A

(51) Int. Cl.
*C10M 125/00* (2006.01)
*C10M 125/02* (2006.01)
(52) U.S. Cl. ....................... 508/123; 508/155
(58) Field of Classification Search .............. 508/123, 508/155
See application file for complete search history.

(56) References Cited

U.S. PATENT DOCUMENTS
2009/0220556 A1 * 9/2009 Shenderova et al. .......... 424/401

FOREIGN PATENT DOCUMENTS
| CN | 1952036 A | 4/2007 |
| CN | 1982404 A | 6/2007 |
| WO | WO2008030690 A1 | 3/2008 |
| WO | WO 2008030690 A1 * | 3/2008 |

* cited by examiner

*Primary Examiner* — Jim Goloboy
(74) *Attorney, Agent, or Firm* — Ming Chow; Sinorica, LLC

(57) ABSTRACT

The present invention discloses a nanodiamond thermal grease, which comprises a nanodiamond powder, a thermal powder and a substrate. The nanodiamond powder has volume percentage of 5% to 30%, the thermal powder has volume percentage of 40% to 90%, and the substrate has volume percentage of 5% to 30%. The nanodiamond powder and the thermal powder are distributed uniformly in the substrate to form the nanodiamond thermal grease having high thermal conductivity.

5 Claims, 1 Drawing Sheet

NANODIAMOND THERMAL GREASE

FIELD OF THE INVENTION

The present invention is related to a nanodiamond thermal grease, particularly related to a nanodiamond thermal grease which uses the high thermal conductivity of nanodiamond to conduct the heat generated by an electronic element during operation to the thermal pad, so as to maintain the effect of electronic element.

BACKGROUND OF THE INVENTION

At present, microminiaturization has become the most important topic for development of integrated circuit. Because sizes of electronic elements become smaller, and their operating speeds become faster, how to dissipate the heat generated by an electronic element during operation so as to maintain its working performance and stability has become one of the points for every industry's research.

In order to effectively dissipate heat generated by an electronic element during operation, in common manner, a thermal grease having high thermal conductivity is daubed on the surface of the electronic element to fill in the gaps between the electronic element and the thermal pad, so that the heat energy can be conducted to the thermal pad more efficiently. However, conventional thermal grease contains a lot of bonding agent which has low thermal conductivity thereby results in bad thermal conductivity of the entire thermal grease. Besides, many thermal greases uses nano-grade materials with high conductivity for better performance, but the nano-grade powder in substrate tends to shrink surface area to be stable, and it results in the powders tend to cluster and become a particle with a big diameter, and causes bad effects in filling the gaps between the electronic element and the thermal pad, thereby affecting the thermal conductivity performance of thermal grease.

In view of the defects of prior art, the inventor of the present invention discloses a nanodiamond thermal grease based on many years and experience of research and many times of revision. The nanodiamond thermal grease uses thermal conductive materials with high purity which is processed with nano technology for thinner molecular structure and better thermal conductivity. The nanodiamond thermal grease of the present invention can be not only used in heat dissipating interface of high brightness LED, CPU, graphic chips of various display cards, but in power electronic products, such as power supply and other high power chips.

SUMMARY

Therefore, one of objects of the present invention is to provide a nanodiamond thermal grease to reduce the cost and enhance the heat dissipating efficiency.

According to the object of the present invention, the present invention discloses a nanodiamond thermal grease comprising a nanodiamond powder having volume percentage of 5% to 30%; a thermal powder having volume percentage of 40% to 90%; a substrate having volume percentage of 5% to 30%. The nanodiamond powder and the thermal powder are distributed uniformly in the substrate, so that nanodiamond thermal grease has high thermal conductivity.

Preferably, the nanodiamond powder is a diamond having a diameter smaller than or equal to 100 nm.

Preferably, the thermal powder further comprises a first thermal powder and a second thermal powder, and the diameter of the first thermal powder is bigger than that of the second thermal powder.

Preferably, the thermal powder comprises metal powder, metal oxide powder, carbon compound powder, silicon compound powder, or the combinations thereof.

Preferably, the substrate comprises polyvinyl acetate, polyethylene, acrylate, polypropylene, epoxy resin, polyformaldehyde, polyvinyl alcohol, olefin resin, silicon oil, glycerin, olive oil, paraffin oil, stearic acid, or the combinations thereof.

Besides, the present invention further discloses a method of manufacturing nanodiamond thermal grease, comprising the following steps. First, the substrate is heated, and then the nanodiamond powder is put into the preheated substrate. A disperser is used to disperse the nanodiamond powder in the substrate. The thermal powder is put into the mixture of the substrate and nanodiamond, and the mixture is blend evenly to form nanodiamond thermal grease.

Preferably, the disperser is an ultrasonic disperser.

Preferably, the nanodiamond powder is a diamond having a diameter smaller than or equal to 100 nm.

Preferably, the thermal powder further comprises a first thermal powder and a second thermal powder, and the diameter of the first thermal powder is bigger than that of the second thermal powder.

Preferably, the thermal powder comprises metal powder, metal oxide powder, carbon compound powder, silicon compound powder, or the combination thereof.

Preferably, the substrate comprises polyvinyl acetate, polyethylene, acrylate, polypropylene, epoxy resin, polyformaldehyde, polyvinyl alcohol, olefin resin, silicon oil, glycerin, olive oil, paraffin oil, stearic acid, or the combinations thereof.

As the abovementioned, the nanodiamond thermal grease of the present invention has one or more than one advantages as follow:

(1) The nanodiamond thermal grease contains nano-sized diamond, which has high conductivity. Meanwhile, nano-sized particle can fill the protrusion and depression of electronic elements effectively, thereby the thermal conductivity effect of nanodiamond thermal grease better than prior art can be obtained.

(2) The method of manufacturing the nanodiamond thermal grease comprises a manner of using an ultrasonic disperser to solve the problem that nanodiamond is tend to cluster and form a big particle. By the manner, the μm-grade and nm-grade diamond can be actually produced for commercial purpose.

DETAILED DESCRIPTION

Figure 1:
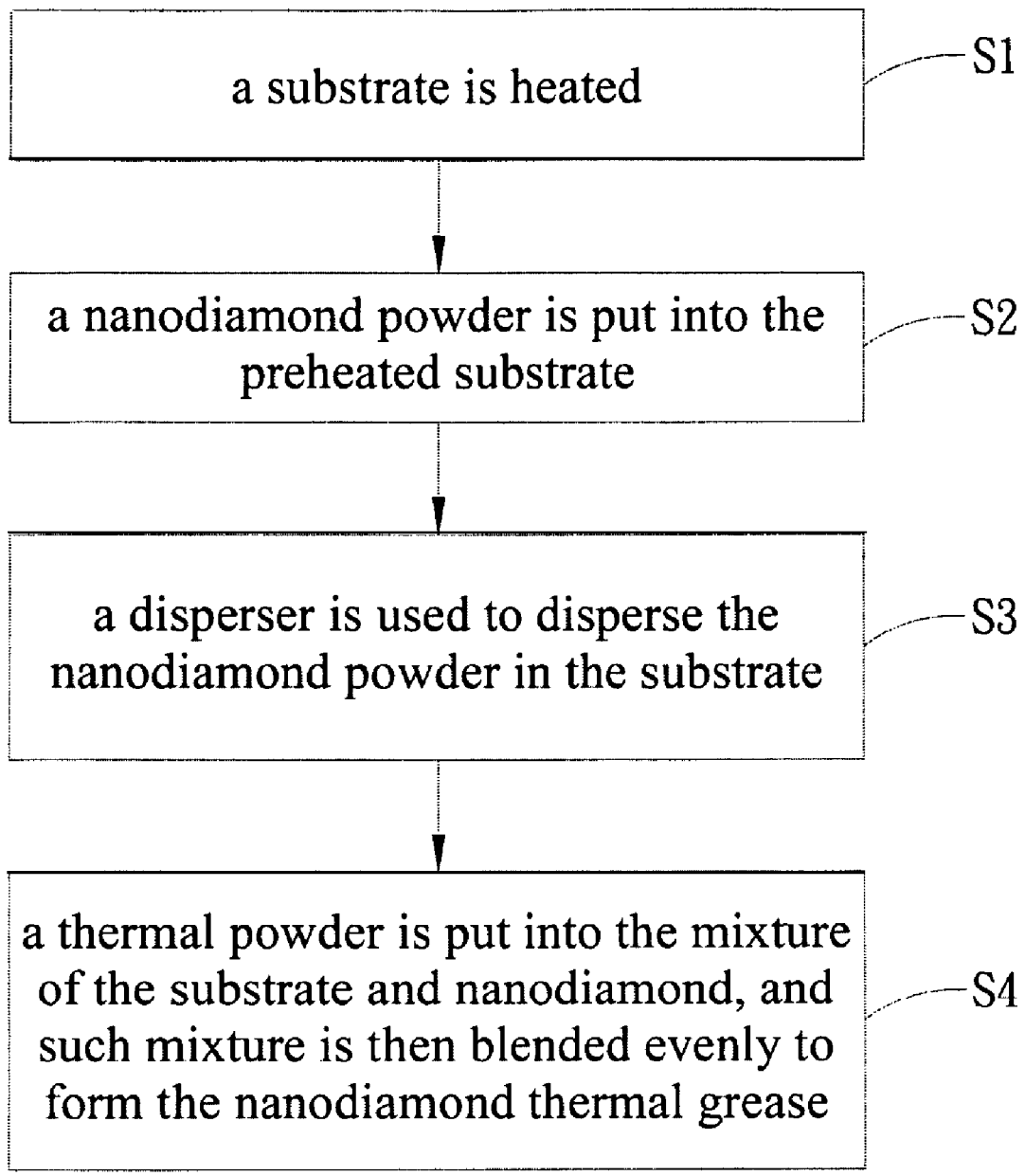
FIG. 1 is a flow chart of a method of manufacturing nanodiamond thermal grease of the present invention.

Exemplary embodiments of the present invention are described herein in the context of a nanodiamond thermal grease.

Those of ordinary skilled in the art will realize that the following detailed description of the exemplary embodiment(s) is illustrative only and is not intended to be in any way limiting. Other embodiments will readily suggest themselves to such skilled persons having the benefit of this disclosure. Reference will now be made in detail to implementations of the exemplary embodiment(s) as illustrated in the accompanying drawings. The same reference indicators will be used throughout the drawings and the following detailed description to refer to the same or like parts.

The present invention provides a nanodiamond thermal grease, which comprises a nanodiamond powder, a thermal powder and a substrate. The volume percentage of the nanodiamond powder is in a range of 5% to 30%, and the volume percentage of the thermal powder is 40% to 90%, and the volume percentage of the substrate is 5% to 30%. The nanodiamond powder and the thermal powder are distributed uniformly in the substrate, so that a nanodiamond thermal grease having high conductivity rate can be obtained.

Preferably, the thermal powder comprises a first thermal powder and a second thermal powder, and the diameter of the first thermal powder is bigger than that of the second thermal powder. Preferably, the first thermal powder can be a powder with a diameter of 15 μm to 50 μm. Preferably, the second thermal powder can be a powder with a diameter of 1 μm to 10 μm. Preferably, the first thermal powder can be a powder with a volume percentage of 20% to 40%. Preferably, the second thermal powder can be a powder with a volume percentage of 10% to 30%. The thermal powders with different particle diameters can efficiently fill the protrusion and the depression of electronic elements, meanwhile, the cost can be reduced and the heat dissipating efficiency can be enhanced. By the manner, a nanodiamond thermal grease with thermal conductivity effect better than prior art and with reduced cost can be obtained.

Besides, the nanodiamond powder is a diamond particle having a diameter smaller than or equal to 100 nm. Preferably, the thermal powder can comprise metal powder, metal oxide powder, carbon compound powder, silicon compound powder or the combinations thereof. Preferably, the metal powder can comprise copper, aluminum, nickel, nickel baron or the combinations thereof. Preferably, the metal oxide powder can comprise aluminum oxide, zinc oxide, titanium dioxide, or the combinations thereof. Preferably, the carbon compound powder can comprise graphite, carbon black, carbon soot, silicon carbide, aluminum carbide or the combinations thereof. Preferably, the silicon compound powder can comprise silicon carbide, silicon dioxide or the combinations thereof. Preferably, the substrate can comprise polyvinyl acetate, polyethylene, acrylate, polypropylene, epoxy resin, polyformaldehyde, polyvinyl alcohol, olefin resin, silicon oil, glycerin, olive oil, paraffin oil, stearic acid, or the combinations thereof.

FIG. 1 illustrates a flow chart of a method of manufacturing a nanodiamond thermal grease of the present invention. The method comprises the following steps. In step S1, a substrate is heated. Preferably, a certain amount of the substrate is put into a heating furnace, and the temperature of heating furnace is raised for 10-20 minutes to preheat. Preferably, the substrate can comprise polyvinyl acetate, polyethylene, acrylate, polypropylene, epoxy resin, polyformaldehyde, polyvinyl alcohol, olefin resin, silicon oil, glycerin, olive oil, paraffin oil, stearic acid, or the combinations thereof.

In step S2, a nanodiamond powder is put into the preheated substrate. Preferably, the nanodiamond powder is a diamond having a diameter smaller than or equal to 100 nm.

In step S3, a disperser is used to disperse the nanodiamond powder in the substrate. Because the nanodiamond powder is tend to cluster and form a particle with a big diameter, such particles with a big diameter can not fill in the gaps between the electronic elements and the thermal pad efficiently. In order to prevent the performance of heat dissipation from being affected by such particles, the disperser is used to make the nanodiamond powder be distributed uniformly in the substrate steadily. Preferably, the disperser can be implemented by an ultrasonic disperser.

In step S4, a thermal powder is put into the mixture of the substrate and nanodiamond, and such mixture is then blended evenly to form the nanodiamond thermal grease. By well temperature control and long time agitation, the thermal powder, the nanodiamond powder and the substrate can be mixed uniformly to become a nanodiamond thermal grease. Preferably, the thermal powder can comprise a first thermal powder and a second thermal powder, and the diameter of the first thermal powder is bigger than that of the second thermal powder. The first thermal powder can be a powder with a diameter of 15 μm to 50 μm. The second thermal powder can be a powder with a diameter of 1 μm to 10 μm. The first thermal powder can be a powder with a volume percentage of 20% to 40%, and the second thermal powder can be a powder with a volume percentage of 10% to 30%. The thermal powders with different particle diameters can efficiently fill the protrusion and the depression of electronic elements. Meanwhile, the cost is reduced and the heat dissipating efficiency is enhanced. Therefore, nanodiamond thermal grease with thermal conductivity better than prior art and with reduced cost can be obtained.

Preferably, the thermal powder can comprise metal powder, metal oxide powder, carbon compound powder, silicon compound powder or the combinations thereof. Preferably, the metal powder can comprise copper, aluminum, nickel, nickel baron, or the combinations thereof. Preferably, the metal oxide powder can comprise aluminum oxide, zinc oxide, titanium dioxide, or the combinations thereof. Preferably, the carbon compound powder can comprise graphite, carbon black, carbon soot, silicon carbide, aluminum carbide, or the combinations thereof. Preferably, the silicon compound powder can comprise silicon carbide, silicon dioxide, or the combinations thereof.

Table 1 shows thermal resistance results of respectively using the nanodiamond thermal grease of the embodiment of the present invention, a Japanese thermal grease, and an American thermal grease to CPU of computers.

| Heat conducting dielectric | Rotating speed of fan (rpm) | Voltage (V) | Current (A) | Power (W) | Tc (°C.) | Tin1 (°C.) | Tin2 (°C.) | Tin3 (°C.) | Tin4 (°C.) | Rca (°C./W) | Rca, av (°C./W) |
|---|---|---|---|---|---|---|---|---|---|---|---|
| Nanodiamond thermal grease | 3197 | 25.22 | 4.56 | 115.00 | 62.9 | 31.8 | 30.0 | 32.2 | 31.2 | 0.275 | 0.275 |
| | 3196 | 25.22 | 4.56 | 115.00 | 62.6 | 31.5 | 29.8 | 32.1 | 30.7 | 0.275 | |
| | 3195 | 25.22 | 4.56 | 115.00 | 62.4 | 31.3 | 29.6 | 31.9 | 30.6 | 0.274 | |
| Japanese thermal grease | 3175 | 25.24 | 4.56 | 115.09 | 63.1 | 31.9 | 29.8 | 30.0 | 31.4 | 0.281 | 0.279 |
| | 3186 | 25.20 | 4.56 | 114.91 | 62.6 | 31.6 | 29.5 | 29.8 | 31.1 | 0.279 | |
| | 3188 | 25.24 | 4.56 | 115.09 | 63.2 | 31.9 | 30.1 | 31.4 | 31.6 | 0.278 | |

| Heat conducting dielectric | Rotating speed of fan (rpm) | Voltage (V) | Current (A) | Power (W) | Tc (° C.) | Tin1 (° C.) | Tin2 (° C.) | Tin3 (° C.) | Tin4 (° C.) | Rca (° C./W) | Rca, av (° C./W) |
|---|---|---|---|---|---|---|---|---|---|---|---|
| American thermal grease | 3197 | 25.22 | 4.57 | 115.26 | 62.4 | 30.5 | 29.8 | 31.8 | 30.8 | 0.275 | 0.276 |
| | 3198 | 25.22 | 4.57 | 115.26 | 62.3 | 31.0 | 29.3 | 31.8 | 30.5 | 0.275 | |
| | 3197 | 25.22 | 4.56 | 115.00 | 62.7 | 31.2 | 29.0 | 32.0 | 30.8 | 0.278 | |

In Table 1, Tc is a surface temperature of CPU. Tin 1, Tin 2, Tin 3, Tin 4 are ambient temperatures. After subtracting the average value of the ambient temperature from the surface temperature of CPU, the rest is divided by CPU power to obtain thermal resistance results (Rca) of the used thermal grease. That means the temperature difference at two ends of the thermal route when the constant thermal conducting power of the thermal grease is 1 watt. Therefore, the thermal grease having small thermal resistance can effectively conduct the heat energy to the thermal pad, and has better effect.

As shown in Table 1, in several times of testing, the nanodiamond thermal grease of the embodiment of the present invention gets lower average thermal resistance value (Rca, va) than those of other two commercial thermal greases. Therefore, the nanodiamond thermal grease of the present invention is proved to have inventive steps.

While particular embodiments of the present invention have been shown and described, it will be obvious to those skilled in the art that, based upon the teachings herein, changes and modifications may be made without departing from this invention and its broader aspects. Therefore, the appended claims are intended to encompass within their scope of all such changes and modifications as are within the true spirit and scope of the exemplary embodiment(s) of the present invention.

What is claimed is:

1. A method of manufacturing a nanodiamond thermal grease, comprising the steps of:
   heating a substrate;
   putting a nanodiamond powder into the heated substrate;
   using a disperser to disperse the nanodiamond powder in the substrate; and
   putting a thermal powder into the mixture of the substrate and the nanodiamond powder, and blending the mixture to form the nanodiamond thermal grease;
   wherein the nanodiamond powder is present in a volume percentage of 5% to 30% of the grease; the thermal powder is present in a volume percentage of 40% to 90% of the grease, and comprises a first thermal powder and a second thermal powder, and the particle diameter of the first thermal powder is bigger than the particle diameter of the second thermal powder; the first thermal powder is powder having a diameter of 15 μm to 50 μm; the second thermal powder is powder having a diameter of 1 μm to 10 μm; the substrate is present in a volume percentage of 5% to 30% of the grease; the first and second thermal powders are selected from the group consisting of nickel boron, titanium dioxide, carbon black, carbon soot, aluminum carbide and combinations thereof; and the substrate is selected from the group consisting of polyvinyl acetate, polyethylene, acrylate, polypropylene, polyformaldehyde, polyvinyl alcohol, olive oil, paraffin oil, stearic acid and combinations thereof.

2. The method of claim 1, wherein the disperser is an ultrasonic disperser.

3. The method of claim 1, wherein the nanodiamond powder is a diamond having a diameter smaller than or equal to 100 nm.

4. The method of claim 1, wherein the volume percentage of the first thermal powder is in a range of 20% to 40%.

5. The method of claim 1, wherein the volume percentage of the second thermal powder is in a range of 10% to 30%.

* * * * *